United States Patent
Tsai

(10) Patent No.: US 9,316,907 B2
(45) Date of Patent: Apr. 19, 2016

(54) PHOTOSENSITIVE RESIN COMPOSITION AND USES THEREOF

(71) Applicant: CHI MEI CORPORATION, Tainan (TW)

(72) Inventor: Yu-Jie Tsai, Tainan (TW)

(73) Assignee: CHI MEI CORPORATION, Tainan (TW)

( * ) Notice: Subject to any disclaimer, the term of this patent is extended or adjusted under 35 U.S.C. 154(b) by 0 days.

(21) Appl. No.: 14/195,319

(22) Filed: Mar. 3, 2014

(65) Prior Publication Data

US 2014/0255845 A1 Sep. 11, 2014

(30) Foreign Application Priority Data

Mar. 6, 2013 (TW) .............................. 102107751 A

(51) Int. Cl.

| | |
|---|---|
| G03F 7/033 | (2006.01) |
| G03F 7/032 | (2006.01) |
| G03F 7/031 | (2006.01) |
| G03F 7/027 | (2006.01) |
| G03F 7/16 | (2006.01) |
| G03F 7/00 | (2006.01) |
| G03F 7/038 | (2006.01) |
| H05K 3/28 | (2006.01) |

(52) U.S. Cl.
CPC .............. *G03F 7/033* (2013.01); *G03F 7/0007* (2013.01); *G03F 7/027* (2013.01); *G03F 7/038* (2013.01); *G03F 7/0388* (2013.01); *G03F 7/032* (2013.01); *H05K 3/28* (2013.01)

(58) Field of Classification Search
None
See application file for complete search history.

(56) References Cited

U.S. PATENT DOCUMENTS

| | | | |
|---|---|---|---|
| 5,084,538 A * | 1/1992 | Suzuki et al. ................. | 526/261 |
| 2009/0155516 A1* | 6/2009 | Kobayashi et al. .......... | 428/65.1 |
| 2013/0076458 A1 | 3/2013 | Katou et al. | |

FOREIGN PATENT DOCUMENTS

| | | |
|---|---|---|
| JP | 2004-240241 | 8/2004 |
| JP | 2010-054561 | 3/2010 |
| TW | 201207563 | 2/2012 |
| TW | 201300952 | 1/2013 |

OTHER PUBLICATIONS

English translation of JP2004-240241 A (2004) from machine translation from AIPN Japan Patent Office National Center for Industrial Property Information and Training, generated Sep. 3, 2014, 32 pages.*
English translation of JP 2010-054561 A (2010) from machine translation from AIPN Japan Patent Office National Center for Industrial Property Information and Training, generated Sep. 3, 2014, 20 pages.*
Office Action issued on Aug. 27, 2014 for the corresponding TW Patent Application No. 102107751 cites TW 201300952 and TW 201207563.
US 20130076458 corresponds to TW 201207563, publication year of TW is 2012 and US is 2013.

* cited by examiner

*Primary Examiner* — Cynthia Hamilton
(74) *Attorney, Agent, or Firm* — WPAT, P.C.; Anthony King

(57) ABSTRACT

The invention relates to a photosensitive resin composition that has good heat resistance and good humidity resistance. The invention also provides a method for forming a thin film on a substrate, a thin film on a substrate and an apparatus.

20 Claims, No Drawings

PHOTOSENSITIVE RESIN COMPOSITION AND USES THEREOF

BACKGROUND OF THE INVENTION

1. Field of the Invention

The invention relates to a photosensitive resin composition and a thin film and apparatus formed thereby; particularly, to a photosensitive resin composition for producing a product having good high-temperature resistance and high-humidity resistance.

2. Description of the Related Art

In the manufacturing process of a liquid crystal display component, forming an overcoat on a substrate is an important step. Demanding procedures under harsh conditions are required for manufacturing a liquid crystal display component or a solid-state imaging device, etc. For example, local high temperature occurs when processing by infusion with an acid solvent or alkaline solvent on the surface of substrate or by sputtering to form a wiring electrode layer. Thus, an overcoat is needed to be laid on these components to prevent them from damage. Nowadays, the overcoat is generally made of photosensitive resin by means of coating, exposure and developing, etc.

To enable the overcoat to resist the aforementioned processing, high transparency, high surface hardness and smoothness is required, along with an excellent adhesive force between the overcoat and substrate. Moreover, good water-proofing and strong resistance to solvents, acid and alkali, etc, of the overcoat is also required. In the foregoing characteristics, since the overcoat is formed on a color filter or a substrate, the requirement of high transparency is critical. If the transparency of the overcoat is poor, when applied to the liquid crystal display element, the brightness of the liquid crystal display element is insufficient, and the display quality of the liquid crystal display element is impacted.

To improve the transparency of the overcoat, Japanese Patent Publication No. 2010-054561 disclosed a photosensitive composition for an overcoat, comprising: an alkali-soluble bonding resin (A); an ethylenically unsaturated compound (B); a light initiator (B); and a solvent (D); wherein the bonding equivalent of the unsaturated bond in the ethylenically unsaturated compound (B) is between 90 and 450 g/eq, and the amount of unsaturated double bond of a single compound is between 2 and 4 in the ethylenically unsaturated compound (B); and the average molecular weight of the alkali-soluble bonding resin (A) is between 10,000 and 20,000. Additionally, Japanese Patent Publication No. 2004-240241 has disclosed a photosensitive composition comprising: a copolymer (A), which is polymerized by an ethylenically unsaturated carboxyl (anhydride), an ethylenically unsaturated compound containing an epoxy group and other unsaturated ethenyl compounds; an ethylenically unsaturated ethenyl polymer (B); and a photoinitiator (B). The photoinitiator (B) is 2-butanedione-[-4-methylthio benzene]-2-(O-oxime acetate), 1,2-butanedione-1-(-4-morpholino phenyl)-2-(O-benzoyl oxime), 1,2-octadione-1-[4-thiophenyl benzene]-2[O-(4-methyl benzoyl) oxime] or its analogue. Though the photosensitive composition is able to fabricate an overcoat of high transparency, it presents the poor temperature resistance and humidity resistance.

Therefore, a photosensitive that enhancing the temperature resistance, humidity resistance and transparency of the overcoat at the same time is a target remained to be achieved.

SUMMARY OF THE INVENTION

In the present invention, a specific compound having an ethylenically unsaturated group and photoinitiator are provided to obtain a photosensitive resin composition having good transparency, high-temperature resistance and high-humidity resistance.

Therefore, the invention relates to a photosensitive resin composition comprising:
- an alkali-soluble resin (A);
- a compound having an ethylenically unsaturated group (B);
- a photoinitiator (C); and
- a solvent (D);
- wherein said compound having an ethylenically unsaturated group (B) comprises a dioxane unsaturated compound (B-1) and an isocyanurate unsaturated compound (B-2) represented by Formula (2), and a ratio of the used amount by weight of the dioxane unsaturated compound (B-1)/isocyanurate unsaturated compound (B-2) is from 0.05 to 15; and
- the dioxane unsaturated compound (B-1) comprises a dioxane unsaturated compound having an 1,3-dioxane frame represented by Formula (1-1) and/or a dioxane unsaturated compound having an 1,3-dioxolane frame represented by Formula (1-2):

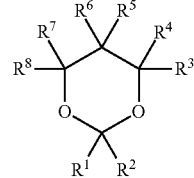

Formula (1-1)

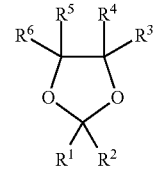

Formula (1-2)

wherein:
in Formula (1-1), $R^1$ to $R^8$ independently represent a hydrogen atom or a hydrocarbon group, and at least one of $R^1$ to $R^8$ has an ethylenically unsaturated group as a substituent at its end portion;
in Formula (1-2), $R^1$ to $R^6$ independently represent a hydrogen atom or a hydrocarbon group, and at least one of $R^1$ to $R^6$ has an ethylenically unsaturated group as a substituent at its end portion;

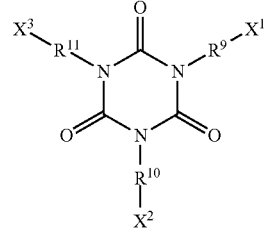

Formula (2)

wherein:
$X^1$, $X^2$ and $X^3$ independently represent a hydrogen atom, (meth)acryloyl group or a hydrocarbon group having 1 to 20 carbon atoms; and at least two of $X^1$, $X^2$ and $X^3$ represent a (meth)acryloyl group; and $R^9$, $R^{10}$ and $R^{11}$ independently represent an oxyalkylene group.

The present invention also provides a method for forming a thin film on a substrate comprising applying the photosensitive resin composition as mentioned above on the substrate.

The present invention also provides a thin film on a substrate, which is obtained by the method as mentioned above.

The present invention further provides an apparatus comprising the thin film as mentioned above

DETAILED DESCRIPTION OF THE INVENTION

The invention relates to a photosensitive resin composition comprising:
- an alkali-soluble resin (A);
- a compound having an ethylenically unsaturated group (B);
- a photoinitiator (C); and
- a solvent (D);
- wherein said compound having an ethylenically unsaturated group (B) comprises a dioxane unsaturated compound (B-1) and an isocyanurate unsaturated compound (B-2) represented by Formula (2), and a ratio of the used amount by weight of the dioxane unsaturated compound (B-1)/isocyanurate unsaturated compound (B-2) is from 0.05 to 15; and
- the dioxane unsaturated compound (B-1) comprises a dioxane unsaturated compound having an 1,3-dioxane frame represented by Formula (1-1) and/or a dioxane unsaturated compound having an 1,3-dioxolane frame represented by Formula (1-2):

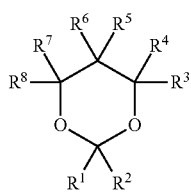

Formula (1-1)

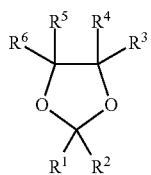

Formula (1-2)

wherein:
- in Formula (1-1), $R^1$ to $R^8$ independently represent a hydrogen atom or a hydrocarbon group, and at least one of $R^1$ to $R^8$ has an ethylenically unsaturated group as a substituent at its end portion;
- in Formula (1-2), $R^1$ to $R^6$ independently represent a hydrogen atom or a hydrocarbon group, and at least one of $R^1$ to $R^6$ has an ethylenically unsaturated group as a substituent at its end portion;

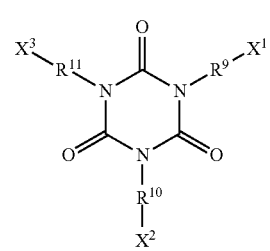

Formula (2)

wherein:
- $X^1$, $X^2$ and $X^3$ independently represent a hydrogen atom, (meth)acryloyl group or a hydrocarbon group having 1 to 20 carbon atoms; and at least two of $X^1$, $X^2$ and $X^3$ represent a (meth)acryloyl group; and
- $R^9$, $R^{10}$ and $R^{11}$ independently represent an oxyalkylene group.

The alkali-soluble resin (A) according to the present invention refers to a resin which can be dissolved in an alkali aqueous solution, with its structure not particularly limited. In the preferred embodiment of the present invention, the alkali-soluble resin (A) include but is not limited to an alkali-soluble resin (A-1), an alkali-soluble resin (A-2) or combinations thereof.

According to the invention, the alkali-soluble resin (A-1) refers to a resin containing a carboxylic acid. More preferably, said alkali-soluble resin (A-1) is polymerized with an unsaturated carboxylic acid or unsaturated carboxylic acid anhydride compound (a1), an unsaturated compound containing an epoxy group (a2), and/or an other unsaturated compound (a3) in a solvent with an appropriate polymerization initiator.

The preferred composition ratio of the unsaturated carboxylic acid or unsaturated carboxylic acid anhydride compound (a1) according to the present invention is 5 to 50 parts by weight. The unsaturated carboxylic acid or unsaturated carboxylic acid anhydride compound (a1) refers to a compound containing carboxylic acid or carboxylic acid anhydride structure and unsaturated bond for polymerization, with its structure not particularly limited, e.g., an unsaturated monocarboxylicacid compound, an unsaturated dicarboxylic acid compound, an unsaturated anhydride compound, a polycyclic unsaturated carboxylic acid compound, a polycyclic unsaturated dicarboxylic acid compound, and a polycyclic unsaturated anhydride compound.

In one embodiment of the present invention, the unsaturated monocarboxylic acid compound refers to (meth)acrylic acid, butenoic acid, α-chloroacrylic acid, ethyl acrylic acid, cinnamic acid, 2-(meth)acryloyloxyethyl succinate, 2-(meth)acryloyloxyethyl hexahydrophthate, 2-(meth)acryloyloxyethyl phthate, and omega-carboxyl polycaprolactone polyol monoacrylic acid (trade name as ARONIX M-5300, made by Toagosei).

In one embodiment of the present invention, the unsaturated dicarboxylic acid compound refers to maleic acid, fumaric acid, methyl fumaric acid, itaconic acid, and citraconic acid, etc. In one embodiment of the present invention, the unsaturated dicarboxylic acid anhydride compound refers to an anhydride compound of said unsaturated dicarboxylic acid compound.

In one embodiment of the present invention, the polycyclic unsaturated carboxylic acid compound refers to 5-carboxylbicyclo[2.2.1]hept-2-ene, 5-carboxyl-5-methylbicyclo[2.2.1]hept-2-ene, 5-carboxyl-5-ethylbicyclo[2.2.1]hept-2- ene, 5-carboxyl-6-methylbicyclo[2.2.1]hept-2-ene, and 5-carboxyl-6-ethylbicyclo[2.2.1]hept-2-ene.

In one embodiment of the present invention, the polycyclic unsaturated dicarboxylic acid compound refers to the 5,6-dicarboxylicbicyclo[2.2.1]hept-2-ene. In one embodiment of the present invention, the polycyclic unsaturated dicarboxylic acid anhydride compound refers to an anhydride compound of said polycyclic unsaturated dicarboxylic acid compound.

In one embodiment of the present invention, the unsaturated carboxylic acid or unsaturated carboxylic acid anhydride compound (a1) refers to acrylic acid, methacrylic acid, maleic anhydride, 2-methacrylethoxyl succinic acid, and 2-methacrylethoxyl hexahydrophthalic acid. The unsaturated carboxylic acid or unsaturated carboxylic acid anhydride compound (a1) can be used independently or mixedly.

The preferred composition ratio of the unsaturated compound containing an epoxy group (a2) according to the present invention is 10 to 70 parts by weight. Examples of the unsaturated compound containing an epoxy group (a2) are as follows: (meth)acrylate compound containing an epoxy group, α-alkyl acrylate compound containing an epoxy group, and epoxypropyl ether.

In one embodiment of the present invention, the (meth)acrylate compound containing an epoxy group refers to epoxypropyl (meth)acrylate (glycidyl (meth)acrylate), 2-methyl epoxypropyl (meth)acrylate, 3,4-epoxybutyl (meth)acrylate, 6,7-epoxyheptyl (meth)acrylate, 3,4-epoxycyclohexyl (meth)acrylate, and 3,4-epoxycyclohexylmethyl (meth)acrylate.

In one embodiment of the present invention, the α-alkyl acrylate compound containing an epoxy group refers to α-ethyl epoxypropyl acrylate, α-n-propyl epoxypropyl acrylate, α-n-butyl epoxypropyl acrylate, and α-ethyl 6,7-epoxyheptyl acrylate.

In one embodiment of the present invention, the epoxypropyl ether refers to o-vinylbenzylglycidylether, m-vinylbenzylglycidylether), and p-vinylbenzylglycidylether.

The preferred embodiment of the present invention, the unsaturated compound containing an epoxy group (a2) refers to epoxypropyl (meth)acrylate (glycidyl (meth)acrylate), 3,4-epoxycyclohexylmethyl (meth)acrylate, 6,7-epoxyheptyl (meth)acrylate, o-vinylbenzylglycidylether, m-vinylbenzylglycidylether), and p-vinylbenzylglycidylether.

The preferred composition ratio of the other unsaturated compound (a3) is 0 to 70 parts by weight. Examples of said other unsaturated compound (a3) are alkyl (meth)acrylate, alicyclic (meth)acrylate, aryl (meth)acrylate, unsaturated dicarboxylic acid diester, hydroxyalkyl (meth)acrylate, polyether of (meth)acrylate, an aromatic ethylene compound, and other unsaturated compounds.

In one embodiment of the present invention, the alkyl (meth)acrylate refers to methyl (meth)acrylate, ethyl (meth)acrylate, n-propyl (meth)acrylate, isopropyl (meth)acrylate, n-butyl (meth)acrylate, isobutyl (meth)acrylate, dibutyl (meth)acrylate, and tert-butyl (meth)acrylate.

In one embodiment of the present invention, the alicyclic (meth)acrylate refers to cyclohexyl (meth)acrylate, 2-methyl cyclohexyl (meth)acrylate, tricyclic [5.2.1.0$^{2,6}$]decane-8-ol (meth)acrylate (also called dicyclopentanyl (meth)acrylate), bicyclic pentyloxy ethyl (meth)acrylate, isobornyl (meth)acrylate, and tetrahydrofuran (meth)acrylate.

In one embodiment of the present invention, the aryl (meth)acrylate refers to phenyl (meth)acrylate and benzyl (meth)acrylate.

In one embodiment of the present invention, the unsaturated dicarboxylic acid diester refers to diethyl maleate, diethyl fumarate, and diethylitaconate.

In one embodiment of the present invention, the hydroxyalkyl refers to 2-hydroxyethyl (meth)acrylate and 2-hydroxypropyl (meth)acrylate.

In one embodiment of the present invention, the polyether of (meth)acrylate refers to polyethylene glycol mono(meth)acrylate and polypropylene glycol mono(meth)acrylate.

In one embodiment of the present invention, the aromatic ethylene compound refers to styrene, α-methylstyrene, m-methylstyrene, o-methylstyrene, and p-methoxy styrene.

In one embodiment of the present invention, other unsaturated compounds refer to acrylonitrile, methacrylonitrile, vinyl chloride, vinylidene chloride, acrylamide, methacrylamide, ethylacetate, 1,3-butadiene, isoprene, 2,3-dimethyl 1,3-butadiene, N-cyclohexylmaleimide, N-phenylmaleimide, N-benzylmaleimide, N-succinimidoyl-3-maleimidylbenzoate, N-succinimidoyl-4-maleimidylbutyrate, N-succinimidoyl-6-maleimidylhexanoate, N-succinimidoyl-3-maleimidylpropionate, and N-(9-acridinyl)maleimide.

The preferred embodiments of the other unsaturated compound (a3) are methyl (meth)acrylate, n-butyl (meth)acrylate, 2-hydroxyethyl (meth)acrylate, tert-butyl (meth)acrylate, phenmethylmethacrlate, bicyclic pentyloxy ethyl (meth)acrylate, styrene, and p-methoxystyrene. The other unsaturated compound (a3) according to the invention can be used independently or mixedly.

In one embodiment of the present invention, the solvent used for synthesizing the alkali-soluble resin (A) is an alcohol, ether, glycol ether, ethylene glycol alkyl ether acetate, diethylene glycol, dipropylene glycol, propylene glycol monoalkyl ether, propylene glycol alkyl ether acetate, propylene glycol alkyl ether propionate, aromatic hydrocarbon, ketone, and ester.

In one embodiment of the present invention, the alcohol refers to methanol, ethanol, benzyl alcohol, 2-phenylethanol, and 3-phenyl-1-propanol.

In one embodiment of the present invention, the ether refers to tetrahydrofuran.

In one embodiment of the present invention, the glycol ether refers to ethylene glycol monopropyl ether, ethylene glycol monomethyl ether, and ethylene glycol monoethyl ether.

In one embodiment of the present invention, the ethylene glycol alkyl ether acetate refers to ethylene glycol butyl ether acetate, ethylene glycol ethyl ether acetate, and ethylene glycol methyl ether acetate.

In one embodiment of the present invention, the diethylene glycol refers to diethylene glycol monomethyl ether, diethylene glycol monoethyl ether, diethylene glycol monobutyl ether, diethylene glycol dimethyl ether, diethylene glycol diethyl ethe, and diethylene glycol methylethyl ether.

In one embodiment of the present invention, the dipropylene glycol refers to dipropylene glycol monomethyl ether, dipropylene glycol monoethyl ether, dipropylene glycol dimethyl ether, dipropylene glycol diethyl ether, and dipropylene glycol methylethyl ether.

In one embodiment of the present invention, the propylene glycol monoalkyl ether refers to propylene glycol monomethyl ether, propylene glycol monoethyl ether, propylene glycol monopropyl ether and propylene glycol monobutyl ether.

In one embodiment of the present invention, the propylene glycol alkyl ether acetate refers to propylene glycol methyl ether acetate, propylene glycol ethyl ether acetate, propylene glycol propyl ether acetate, and propylene glycol butyl ether acetate.

In one embodiment of the present invention, the propylene glycol alkyl ether propionate refers to propylene glycol methyl ether propionate, propylene glycol diethyl ether propionate, propylene glycol propyl ether propionate, and propylene glycol butyl ether propionate.

In one embodiment of the present invention, the aromatic hydrocarbon refers to toluene and dimethylbenzene.

In one embodiment of the present invention, said ketone refers to methyl ethyl ketone, cyclohexanone and diacetone alcohol.

In one embodiment of the present invention, said ester refers to methyl acetate, ethyl acetate, propyl acetate, butyl acetate, ethyl 2-hydroxy propionate, methyl 2-hydroxy-2-methyl propionate, ethyl 2-hydroxy-2-methyl propionate, methyl glycolate, ethyl glycolate, butyl glycolate, methyl lactate, propyl lactate, butyl lactate, methyl 3-hydroxy propionate, ethyl 3-hydroxy propionate, propyl 3-hydroxy propionate, butyl 3-hydroxy propionate, methyl 2-hydroxy-3-methyl butanoate, methyl methoxy acetate, ethyl methoxy acetate, butyl methoxy acetate, methyl ethoxy acetate, ethyl ethoxy acetate, propyl ethoxy acetate, butyl ethoxy acetate, methyl propoxy acetate, ethyl propoxy acetate, propyl propoxy acetate, butyl propoxy acetate, methyl butoxy acetate, ethyl butoxy acetate, propyl butoxy acetate, butyl butoxy acetate, butyl 3-methoxyl acetate, methyl 2-methoxy propionate, ethyl 2-methoxy propionate, propyl 2-methoxy propionate, butyl 2-methoxy propionate, methyl 2-ethoxy propionate, ethyl 2-ethoxy propionate, propyl 2-ethoxy propionate, butyl 2-ethoxy propionate, methyl 2-butoxy propionate, ethyl 2-butoxy propionate, propyl 2-butoxy propionate, butyl 2-butoxy propionate, methyl 3-methoxy propionate, ethyl 3-methoxy propionate, propyl 3-methoxy propionate, butyl 3-methoxy propionate, methyl 3-ethoxy propionate, ethyl 3-ethoxy propionate, propyl 3-ethoxy propionate, butyl 3-ethoxy propionate, methyl 3-propoxy propionate, ethyl 3-propoxy propionate, propyl 3-propoxy propionate, butyl 3-propoxy propionate, methyl 3-butoxy propionate, ethyl 3-butoxy propionate, propyl 3-butoxy propionate, and butyl 3-butoxy propionate.

In one preferred embodiment of the present invention, the solvent used for synthesizing the alkali-soluble resin (A) is diethylene glycol dimethyl ether and propylene glycol methyl ether acetate. The solvent used for synthesizing the alkali-soluble resin (A) according to the invention can be used independently or mixedly.

Examples of the polymerization initiator used for synthesizing the alkali-soluble resin (A) according to the present invention are an azo compound or a peroxide.

Examples of said azo compound are 2,2-azodiisobutyronitrile, 2,2'-azobis(2,4-dimethylvaleronitrile), 2'-azobis(4-methoxy-2,4-dimethylvaleronitrile), 2,2'-azobis-2-methylbutyronitrile, 4,4'-azobis(4-cyanovaleric acid), dimethyl 2,2'-azobis(2-methyl propionate), and 2,2'-azobis(4-methoxyl-2,4-dimethylvaleronitrile).

Examples of said peroxide are benzoyl peroxide, dilauroyl peroxide, tert-butyl peroxypivalate, 1,1-di(tert-butylperoxy)cyclohexane, and hydrogen peroxide.

The polymerization initiator used for synthesizing the alkali-soluble resin (A) according to the present invention can be used independently or mixedly.

The average molecular weight of the alkali-soluble resin (A) according to the present invention is generally 3,000 to 100,000; preferably 4,000 to 80,000; more preferably 5,000 to 60,000. The molecular weight of the alkali-soluble resin (A) can be adjusted by using a single resin or two or more resins with different molecular weights.

In one preferred embodiment of the invention, the alkali-soluble resin (A-2) comprises a fluorine resin, an urethane resin or a novolac resin.

According to the invention, examples of the fluorine resin are V259ME, V259MEGTS or V500MEGT (manufactured by Nippon Steel Chemical Co.). The resin can be used independently or mixedly.

According to the invention, examples of the urethane resin are UN-904, UN-952, UN-333 or UN1255 (manufactured by Negami Chemical Industrial Co., Ltd). The resin can be used independently or mixedly.

According to the invention, examples of the novolac resin are EP4020G, EP4080G, TR40B45G or EP30B50 (manufactured by Asahi Organic Chemical Industrial Co., Ltd). The resin can be used independently or mixedly.

According to the invention, the compound having an ethylenically unsaturated group (B) comprises a dioxane unsaturated compound (B-1) and an isocyanurate unsaturated compound (B-2) represented by Formula (2).

According the invention, the dioxane unsaturated compound (B-1) comprises an 1,3-dioxane frame or an 1,3-dioxolane frame. A dioxane unsaturated compound having an 1,3-dioxane frame is represented by Formula (1-1); a dioxane unsaturated compound having an 1,3-dioxolane frame represented by Formula (1-2):

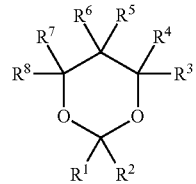

Formula (1-1)

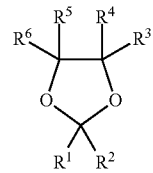

Formula (1-2)

wherein:

in Formula (1-1), $R^1$ to $R^8$ independently represent a hydrogen atom or a hydrocarbon group, and at least one of $R^1$ to $R^8$ has an ethylenically unsaturated group as a substituent at its end portion;

in Formula (1-2), $R^1$ to $R^6$ independently represent a hydrogen atom or a hydrocarbon group, and at least one of $R^1$ to $R^6$ has an ethylenically unsaturated group as a substituent at its end portion.

When $R^1$ to $R^8$ are a hydrocarbon group, they preferably represent a hydrocarbon group having 1 to 18 carbon atoms. Examples thereof are an alkyl, aryl, aralkyl, alkenyl, or cycloalkyl group; wherein preferably are an alkyl group.

When $R^1$ to $R^8$ are an alkyl group, they preferably represent a linear or branched alkyl group having 1 to 8 carbon atoms; more preferably represent a linear alkyl group having 1 to 4 carbon atoms; still more preferably represent a methyl or ethyl group.

In Formula (1-1), at least one of $R^1$ to $R^8$ has an ethylenically unsaturated group as a substituent at its end portion; or in Formula (1-2), at least one of $R^1$ to $R^6$ has an ethylenically unsaturated group as a substituent at its end portion. The use of the ethylenically unsaturated substituent is not limited.

More preferably, the ethylenically unsaturated substituent is (meth)acryloxy or (meth)acrylamide, and reactivity and flexibility of the resulting polymeric product are improved.

Preferably, the substituent at the end portion of $R^1$ to $R^8$ in Formula (1-1) or $R^1$ to $R^6$ in Formula (1-2) comprises one to two (meth)acrylic acid derivatives, and viscosity of the compound and the physical properties of a cured product are improved.

In one preferred embodiment of the invention, the dioxane unsaturated compound (B-1) is represented by Formulae (1-3) to (1-25):

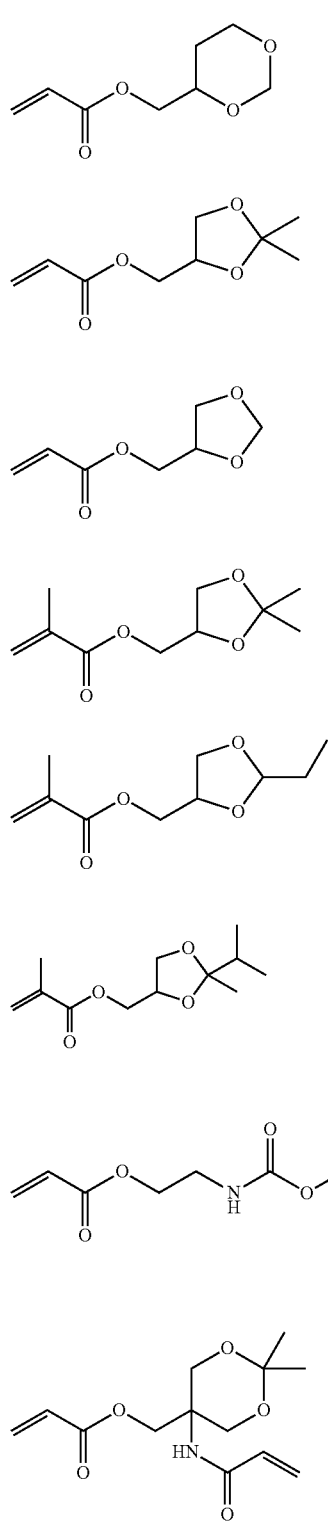

Formula (1-19)
Formula (1-20)
Formula (1-21)
Formula (1-22)
Formula (1-23)
Formula (1-24)
Formula (1-25)

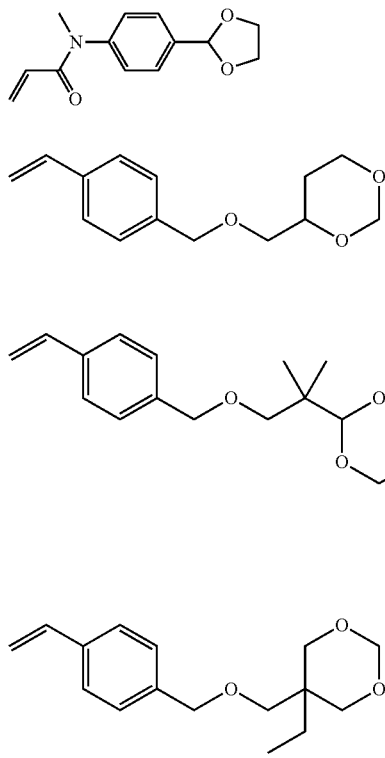
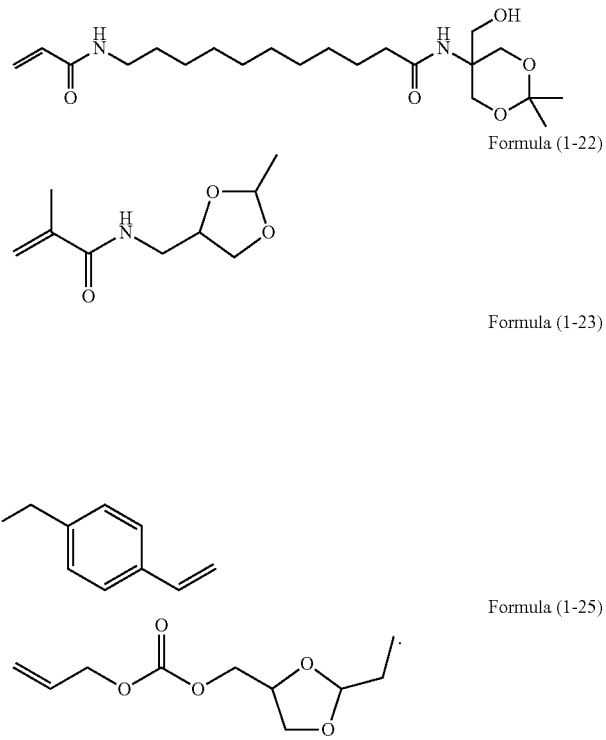

In one more preferred embodiment of the invention, the dioxane unsaturated compound (B-1) is represented by Formula (1-4), Formula (1-5), Formula (1-6), Formula (1-15), and Formula (1-16).

The isocyanurate unsaturated compound (B-2) according to the invention is represented by Formula (2):

Formula (2)

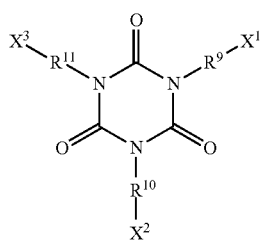

wherein:
X$^1$, X$^2$ and X$^3$ independently represent a hydrogen atom, (meth) acryloyl group or a hydrocarbon group having 1 to 20 carbon atoms; and at least two of X$^1$, X$^2$ and X$^3$ represent a (meth)acryloyl group; and
R$^9$, R$^{10}$ and R$^{11}$ independently represent an oxyalkylene group.

In Formula (2), X$^1$, X$^2$ and X$^3$ represent a (meth)acryloyl group; preferably, two or three of X$^1$, X$^2$ and X$^3$ represent a (meth)acryloyl group and hardness is improved; more preferably, three of X$^1$, X$^2$ and X$^3$ represent a (meth)acryloyl group.

In Formula (2), X$^1$, X$^2$ and X$^3$ represent a hydrocarbon group having 1 to 20 carbon atoms; preferably a hydrocarbon group having 1 to 4 carbon atoms and solubility is improved.

In one embodiment of the invention, the hydrocarbon group having 1 to 20 carbon atoms is methyl, ethyl, n-propyl, isopropyl, n-butyl, iso-butyl, sec-butyl, tert-butyl, hexyl, octyl, nonyl, lauryl, tridecyl, tetradecyl, hexadecyl, octadecyl, 2-ethylhexyl, or 2-ethyloctyl.

R$^9$, R$^{10}$ and R$^{11}$ independently represent an oxyalkylene group; preferably an oxyalkylene group having 2 to 10 carbon atoms, such as an oxyalkylene group of ethylene, propylene, butylene, hexylene, octylene, decylene, 2-ethylhexylene, 2-ethyl octylene; more preferably, an oxyalkylene group having 2 to 6 carbon atoms, such as an oxyethylene group, an oxypropylene group or an oxybutylene group.

Examples of the isocyanurate unsaturated compound (B-2) according to the invention are acryloyl isocyanurate, such as tris(acryloyloxyethyl) isocyanurate, tris(2-acryloyloxypropyl) isocyanurate, bis(acryloyloxyethyl) hydroxyethyl isocyanurate, bis(2-acryloyloxypropyl)-2-ethoxypropyl isocyanurate, and tris [acryloyloxybis(oxyethyl)] isocyanurate; or methacryloyl isocyanurate, such as tris(methacryloyloxyethyl) isocyanurate, tris(2-methacryloyloxypropyl) isocyanurate, bis(methacryloyloxyethyl) methoxyethyl isocyanurate, bis(2-methacryloyloxypropyl)-2-hydroxypropyl isocyanurate, and tris [methacryloyloxybis(oxyethyl)] isocyanurate.

The preferred examples of the isocyanurate unsaturated compound (B-2) according to the invention are bis(acryloyloxyethyl)hydroxyethyl isocyanurate, tris [acryloyloxybis(oxyethyl)] isocyanurate, tris(acryloyloxyethyl) isocyanurate, and tris(methacryloyloxyethyl) isocyanurate.

In one another embodiment of the invention, the compound having an ethylenically unsaturated group (B) further comprises an other compound having an ethylenically unsaturated group (B-3) which is a compound having at least one ethylenically unsaturated group.

Examples of the compound having an ethylenically unsaturated group include, but are not limited to, acrylamide, (meth)acryloylmorpholine, 7-amino-3,7-dimethyloctyl (meth)acrylate, iso-butoxymethyl (meth)acrylamide, iso-bornyloxyethyl (meth)acrylate, iso-bornyl (meth)acrylate, 2-ethylhexyl (meth)acrylate, ethyl diethylene glycol (meth)acrylate, t-octyl (meth)acrylamide, diacetone (meth)acrylamide, dimethylaminoethyl (meth)acrylate, dodecyl (meth)acrylate, dicyclopentenyloxyethyl (meth)acrylate, dicyclopentenyl (meth)acrylate, N,N-dimethyl (meth)acrylamide, tetrachlorophenyl (meth)acrylate, 2-tetrachlorophenoxy ethyl (meth)acrylate, tetrahydrofurfuryl (meth)acrylate, tetrabromophenyl (meth)acrylate, 2-tetrabromophenoxyethyl (meth)acrylate, 2-trichlorophenoxyethyl (meth)acrylate, tribromophenyl (meth)acrylate, 2-tribromophenoxyethyl (meth)acrylate, 2-hydroxyethyl (meth)acrylate, 2-hydroxypropyl (meth)acrylate, vinylcaprolactam, N-vinylpyrrolidone, phenoxyethyl (meth)acrylate, pentachlorophenyl (meth)acrylate, pentabromophenyl (meth)acrylate, polyethylene glycol mono(meth)acrylate, polypropylene glycol mono(meth)acrylate, bornyl (meth)acrylate, diethylene glycol mono ethyl ether (meth)acrylate, 3-methoxy butyl (meth)acrylate, 2-(meth)acryloyl oxy ethyl-2-hydroxypropyl phthalate, omega-carboxy polycaprolactone monoacrylate, ARONIX M-101, M-111, M-114, M-5300 (manufactured by Toagosei®), KAYARAD TC-110S, TC-120S (manufactured by Nippon Kayaku®), Viscoat 158, 2311 (manufactured by Osaka Organic Chemical Industry Ltd.), or like.

Examples of the compound having two or more than two ethylenically unsaturated groups include, but are not limited to, diethylene glycol di(meth)acrylate, dicyclopentenyl di(meth)acrylate, triethylene glycol diacrylate, tetraethylene glycol di(meth)acrylate, tri(2-hydroxyethyl) isocyanate di(meth)acrylate, tri(2-hydroxyethyl) isocyanate tri(meth)acrylate, caprolactone-modified tri(2-hydroxyethyl) isocyanate tri(meth)acrylate, trimethylolpropyl tri(meth)acrylate, ethylene oxide (hereinafter abbreviated as EO) modified trimethylolpropyl tri(meth)acrylate, propylene oxide (hereinafter abbreviated as PO) modified trimethylolpropyl tri(meth)acrylate, tripropylene glycol di(meth)acrylate, neo-pentyl glycol di(meth)acrylate, 1,4-butanediol di(meth)acrylate, 1,6-hexanediol di(meth)acrylate, 1,9-nonamethylene glycol di(meth)acrylate, bis(ethanolyl phenoxy) fluorene di(meth)acrylate, pentaerythritol tri(meth)acrylate, pentaerythritol tetra(meth)acrylate, polyester di(meth)acrylate, polyethylene glycol di(meth)acrylate, dipentaerythritol hexa(meth)acrylate, dipentaerythritol penta(meth)acrylate, dipentaerythritol tetra(meth)acrylate, caprolactone-modified dipentaerythritol hexa(meth)acrylate, caprolactone-modified dipentaerythritol penta(meth)acrylate, ditrimethylolpropyl tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, PO-modified glycerol triacrylate, EO-modified bisphenol F di(meth)acrylate, phenol novolac polyglycidyl ether (meth)acrylate, tri(2-(meth)acryloyloxyethyl) phosphorylcholine ARONIX M-210, M-240, M-6200, M-309, M-400, M-405, M-450, M-7100, M-8030, M-8060; TO-1450 (manufactured by Toagosei®), KAYARAD HDDA, HX-220, R-604, DPHA, TMPTA, DPCA-20, DPCA-30, DPCA-60, DPCA-120 (manufactured by Nippon Kayaku®), Viscoat 260, 312, 335H.P., 295, 300, 360, GPT, 3PA, 400 (manufactured by Osaka Organic Chemical Industry Ltd.), or the like.

Preferably, the compound having an ethylenic group is selected from trimethylolpropyl triacrylate, EO-modified trimethylolpropyl triacrylate, PO-modified trimethylolpropyl triacrylate, pentaerythritol triacrylate, pentaerythritol tetracrylate, dipentaerythritol hexaacrylate, dipentaerythritol pentaacrylate, dipentaerythritol tetraacrylate, caprolactone-modified dipentaerythritol hexaacrylate, ditrimethylolpropyl tetraacrylate, and PO-modified glycerol triacrylate. The aforesaid examples of the compound having an ethylenic group (B-3) can be used alone or in admixture of two or more thereof.

There is no specific limitation to the amount of the compound having an ethylenically unsaturated group (B) according to the invention used. Artisans skilled in the field can adjust the amount as needed. In one embodiment of the invention, the used amount of the compound having an ethylenically unsaturated group (B) is from 20 to 150 parts by weight based on 100 parts by weight of the used amount of the alkali-soluble resin (A); more preferably, the used amount of the compound having an ethylenically unsaturated group (B) is from 25 to 140 parts by weight; still more preferably, the used amount of the compound having an ethylenically unsaturated group (B) is from 30 to 130 parts by weight. In another aspect, the used amount of the dioxane unsaturated compound (B-1) is from 10 to 140 parts by weight based on 100 parts by weight of the used amount of the alkali-soluble resin (A); more preferably, the used amount of the dioxane unsaturated compound (B-1) is from 15 to 130 parts by weight; still more preferably, the used amount of the dioxane unsaturated compound (B-1) is from 20 to 120 parts by weight. If the dioxane unsaturated compound (B-1) is absent, adhesion is not satisfactory in a high-temperature and high-humidity condition. In still another aspect, the used amount of the isocyanurate unsaturated compound (B-2) is from 10 to 140 parts by weight based on 100 parts by weight of the used amount of the alkali-soluble resin (A); more preferably, the used amount of the isocyanurate unsaturated compound (B-2) is from 15 to 130 parts by weight; still more preferably, the used amount of the isocyanurate unsaturated compound (B-2) is from 20 to 120 parts by weight. If the isocyanurate unsaturated compound (B-2) is absent, adhesion is not satisfactory in a high-temperature and high-humidity condition.

In another aspect, a ratio of the used amount by weight of the dioxane unsaturated compound (B-1)/isocyanurate unsaturated compound (B-2) is from 0.05 to 15; preferably from 0.06 to 14.5; more preferably from 0.07 to 14. If the ratio of the used amount by weight of (B-1)/(B-2) is not between the range, adhesion is not satisfactory in a high-temperature and high-humidity condition.

There is no specific limitation to the photoinitiator (C). In one embodiment of the invention, the photoinitiator (C) includes but is not limited to comprises an O-acyloxime compound (C-1) and an other photoinitiator (C-2).

Preferably, the O-acyloxime compound (C-1) comprises a thio O-acyloxime compound (C-1-1) and an other O-acyloxime compound (C-1-2).

The O-acyloxime compound (C-1-1) is preferably represented by Formula (3),

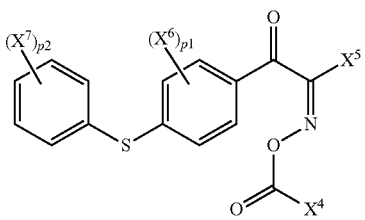

Formula (3)

wherein:
$X^4$ and $X^5$ independently represent a hydrogen atom, a ring, a linear or branched alkyl or aryl group having 1 to 12 carbon atoms, and the alkyl or aryl group is unsubstituted or substituted with a substituent, and the substituent is selected from group consisting of a halogen atom, an alkoxy or aryl group having 1 to 6 carbon atoms;

$X^6$ and $X^7$ independently represent a halogen atom, an alkyl group having 1 to 12 carbon atoms, a cyclopentyl group, a cyclohexyl group, a phenyl group, a benzyl group, a benzoyl group, an alkanoyl group having 2 to 12 carbon atoms, an alkoxycarbonyl group having 2 to 12 carbon atoms, or a phenoxycarbonyl group; and p1 and p2 independently represent an integer from 0 to 5.

Examples of the thio O-acyloxime compound (C-1-1) are 1-[4-(phenylthio)phenyl]-propyl-3-cyclopentane-1,2-dione 2-(O-benzoyloxime), 1-[4-(phenylthio)phenyl]-heptane-1,2-dione 2-(O-benzoyloxime), 1-[4-(phenylthio)phenyl]-octane-1,2-dione 2-(O-benzoyloxime) (such as OXE 01 manufactured by Ciba Specialty Chemicals). The thio O-acyloxime compound (C-1-1) can be used independently or mixedly as needed.

Examples of the other O-acyloxime compound (C-1-2) are 1-[4-(benzoyl)phenyl]-heptane-1,2-dione 2-(O-benzoyloxime), 1-[9-ethyl-6-(2-methylbenzoyl)-9H-carbazol-3-yl]-ethylketo 1-(O-acetyloxime) (such as OXE 02 manufactured by Ciba Specialty Chemicals), 1-[9-ethyl-6-(3-methylbenzoyl)-9H-carbazol-3-yl]ethylketo 1-(O-acetyloxime), 1-[9-ethyl-6-benzoyl-9H-carbazol-3-yl]-ethylketo 1-(O-acetyloxime), ethylketo-1-[9-ethyl-6-(2-methyl-4-tetrahydrofurylbenzoyl)-9H-carbazol-3-yl]-1-(O-acetyloxime), ethylketo-1-[9-ethyl-6-(2-methyl-4-tetrapyranylbenzoyl)-9H-carbazol-3-yl]-1-(O-acetyloxime), ethylketo-1-[9-ethyl-6-(2-methyl-5-tetrafurylbenzoyl)-9H-carbazol-3-yl]-1-(O-acetyloxime), ethylketo-1-[9-ethyl-6-(2-methyl-5-tetrapyranylbenzoyl)-9H-carbazol-3-yl]-1-(O-acetyloxime), ethylketo-1-[9-ethyl-6-(2-methyl-4-tetrafurylmethoxybenzoyl)-9H-carbazol-3-yl]-1-(O-acetyloxime), ethylketo-1-[9-ethyl-6-(2-methyl-5-tetrafurylmethoxybenzoyl)-9H-carbazol-3-yl]-1-(O-acetyloxime), ethylketo-1-[9-ethyl-6-{2-methyl-4-(2,2-dimethyl-1,3-dioxolyl)benzoyl}-9H-carbazol-3-yl]-1-(O-acetyloxime), and ethylketo-1-[9-ethyl-6-{2-methyl-4-(2,2-dimethyl-1,3-dioxolyl)methoxybenzoyl}-9H-carbazol-3-yl]-1-(O-acetyloxime), or the like; preferably are 1-[9-ethyl-6-(2-methylbenzoyl)-9H-carbazol-3-yl]-ethylketo 1-(O-acetyloxime) (OXE 02), ethylketo-1-[9-ethyl-6-(2-methyl-4-tetrafurylmethoxybenzoyl)-9H-carbazol-3-yl]-1-(O-acetyloxime), and ethylketo-1-[9-ethyl-6-{2-methyl-4-(2,2-dimethyl-1,3-dioxolyl)methoxybenzoyl}-9H-carbazol-3-yl]-1-(O-acetyloxime). The other O-acyloxime compound (C-1-2) can be used independently or mixedly as needed.

The thio O-acyloxime compound (C-1-1) is preferably the thio O-acyloxime compound (C-1-1) such as 1-[4-(phenylthio)phenyl]-propyl-3-cyclopentane-1,2-dione 2-(O-benzoyloxime) or 1-[4-(phenylthio)phenyl]-octane-1,2-dione 2-(O-benzoyloxime).

Examples of the other photoinitiator (C-2) are triazine compounds, acetophenone compounds, biimidazole compounds, benzophenone compounds, α-diketone compounds, acyloin compounds, acyloin ether compounds, acylphosphine oxide compounds, quinone compounds, halide compounds, and peroxide compounds.

Examples of the triazine compounds are vinyl-halomethyl-s-triazine compounds, 2-(naphth-1-yl)-4,6-bis-halomethyl-s-triazine compounds and 4-(p-aminophenyl)-2,6-di-halomethyl-s-triazine compounds, or the like.

Examples of the vinyl-halomethyl-s-triazine compounds are 2,4-bis(trichloromethyl)-6-(p-methoxy)styryl-s-triazine, 2,4-bis(trichloromethyl)-3-(1-p-dimethylaminophenyl-1,3-butadienyl)-s-triazine, 2-trichloromethyl-3-amino-6-(p-methoxy)styryl-s-triazine, or the like.

Examples of the 2-(naphth-1-yl)-4,6-bis-halomethyl-s-triazine compounds are 2-(naphtha-1-yl)-4,6-bis-trichloromethyl-s-triazine, 2-(4-methoxy-naphtho-1-yl)-4,6-bis-trichloromethyl-s-triazine, 2-(4-ethoxy-naphtho-1-yl)-4,6-bis-trichloromethyl-s-triazine, 2-(4-butoxy-naphtho-1-yl)-4,6-bis-trichloromethyl-s-triazine, 2-[4-(2-methoxyethyl)-naphtho-1-yl]-4,6-bis-trichloromethyl-s-triazine, 2-[4-(2-ethoxyethyl)-naphtho-1-yl]-4,6-bis-trichloromethyl-s-triazine, 2-[4-(2-butoxyethyl)-naphtho-1-yl]-4,6-bis-trichloromethyl-s-triazine, 2-(2-methoxy-naphtho-1-yl)-4,6-bis-trichloromethyl-s-triazine, 2-(6-methoxy-5-methyl-naphtho-2-yl)-4,6-bis-trichloromethyl-s-triazine, 2-(6-methoxy-naphtho-2-yl)-4,6-bis-trichloromethyl-s-triazine, 2-(5-methoxy-naphtho-1-yl)-4,6-bis-trichloromethyl-s-triazine, 2-(4,7-dimethoxy-naphtho-1-yl)-4,6-bis-trichloromethyl-s-triazine, 2-(6-ethoxy-naphtho-2-yl)-4,6-bis-trichloromethyl-s-triazine, 2-(4,5-dimethoxy-naphtho-1-yl)-4,6-bis-trichloromethyl-s-triazine or the like.

Examples of the 4-(p-aminophenyl)-2,6-di-halomethyl-s-triazine compounds are 4-[p-N,N-di(ethoxycarbonylmethyl)aminophenyl]-2,6-di(trichloromethyl)-s-t-riazine, 4-[o-methyl-p-N,N-di(ethoxycarbonylmethyl)aminophenyl]-2,6-di(tri-chloromethyl)-s-triazine, 4-[p-N,N-di(chloroethyl)aminophenyl]-2,6-di(trichloromethyl)-s-triazine, 4-[o-methyl-p-N,N-di(chloroethyl)aminophenyl]-2,6-di(trichloromethyl)-s-triazine, 4-[p-N-chloroethylaminophenyl]-2,6-di(trichloromethyl)-s-triazine, 4-[p-N-ethoxycarbonylmethylaminophenyl]-2,6-di(trichloromethyl)-s-triazine, 4-[p-N,N-di(phenypaminophenyl)-2,6-di(trichloromethyl)-s-triazine, 4-[p-N-chloroethylcarbonylaminophenyl]-2,6-di(trichloromethyl)-s-triazine, 4-[p-N-(p-methoxyphenyl)carbonylaminophenyl]-2,6-di(trichloromethyl)-s-triazine, 4-[m-N,N-di(ethoxycarbonylmethyl)aminophenyl]-2,6-di(trichloromethyl)-s-triazine, 4-[m-bromo-p-N,N-di(ethoxycarbonylmethyl)aminophenyl]-2,6-di(trichloromethyl)-s-triazine, 4-[m-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-[o-bromo-p-N,N-di(ethoxycarbonylmethyl)aminophenyl]-2,6-di(trichloromethyl)-s-triazine, 4-[o-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2, 6-di(trichloromethyl)-s-triazine, 4-[o-fluoro-p-N,N-di(chloroethyl)aminophenyl]-2,6-di(trichloromethyl)-s-triazine, 4-[m-bromo-p-N,N-di(chloroethyl)aminophenyl]-2,6-di(trichloromethyl)-s-triazine, 4-[m-chloro-p-N,N-di(chloroethyl)aminophenyl]-2,6-di(trichloromethyl)-s-triazine, 4-[m-fluoro-p-N,N-di(chloroethyl)aminophenyl]-2,6-di(trichloromethyl)-s-triazine, 4-(m-bromo-p-N-ethoxycarbonylmethylaminophenyl)-2,6-di(trichloromethyl)-s-triazine, 4-(m-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(o-bromo-p-N-ethoxycarbonylmethylaminophenyl)-2,6-di(trichloromethyl)-s-triazine, 4-(o-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di(trichloromethyl)-s-triazine, 4-(o-fluoro-p-N-chloroethylaminophenyl)-2,6-di(trichloromethyl)-s-triazine, 2,4-bis(trichloromethyl)-6-[3-bromo-4-[N,N-di(ethoxycarbonylmethyl)amino]-phenyl]-1,3,5-triazine, or the like.

The aforesaid examples of the triazine compounds can be used alone or in admixture of two or more thereof. Preferably, the triazine compounds are 4-[m-bromo-p-N,N-di(ethoxycarbonylmethyl)aminophenyl]-2,6-di(trichloromet-hyl)-s-triazine, and 2,4-bis(trichloromethyl)-6-(p-methoxy)styryl-s-triazine. The triazine compounds can be used independently or mixedly as needed.

Examples of the acetophenone compounds are p-dimethylamino-acetophenone, α,α'-dimethoxyazoxyacetophenone, 2,2'-dimethyl-2-phenylacetophenone, p-methoxyacetophenone, 2-methyl-1-[4-(methylthio)phenyl]-2-morpholino-1-propanone, and 2-benzyl-2-N,N-dimethylamino-1-(4-morpholinophenyl)-1-butanone. The aforesaid examples of the acetophenone compounds can be used alone or in admixture of two or more thereof. Preferably, the acetophenone compounds are 2-methyl-1-[4-(methylthio)phenyl]-2-morpholino-1-propanone, and 2-benzyl-2-N,N-dimethylamino-1-(4-morpholinophenyl)-1-butanone. The acetophenone compounds can be used independently or mixedly as needed.

Examples of the biimidazole compounds are as follows: 2,2'-bis(o-chlorophenyl)-4,4',5,5'-tetraphenyl-biimidazole, 2,2'-bis(o-fluorophenyl)-4,4',5,5'-tetraphenyl biimidazole, 2,2'-bis(o-methyl phenyl)-4,4',5,5'-tetraphenyl biimidazole, 2,2'-bis(o-methoxyphenyl)-4,4',5,5'-tetraphenyl biimidazole, 2,2'-bis(o-ethylphenyl)-4,4',5,5'-tetraphenyl biimidazole, 2,2'-bis(p-methoxyphenyl)-4,4',5,5'-tetraphenyl biimidazole, 2,2'-bis(2,2',4,4'-tetramethoxyphenyl)-4,4',5,5'-tetraphenyl biimidazole, 2,2'-bis(2-chlorophenyl)-4,4',5,5'-tetraphenyl biimidazole, and 2,2'-bis(2,4-dichlorophenyl)-4,4',5,5'-tetraphenyl biimidazole. The aforesaid examples of the biimidazole compounds can be used alone or in admixture of two or more thereof. Preferably, the biimidazole compounds are 2,2'-bis(2,4-dichlorophenyl)-4,4',5,5'-tetraphenyl biimidazole.

Examples of the benzophenone compounds include thioxanthone, 2,4-diethylthioxanthone, thioxanthone-4-sulfone, benzophenone, 4,4'-bis(dimethylamino)benzophenone, 4,4'-bis(diethylamino)benzophenone, or the like. The aforesaid examples of the benzophenone compounds can be used alone or in admixture of two or more thereof. Preferably, the benzophenone compounds are 4,4'-bis(diethylamino)benzophenone.

Examples of the α-diketone compounds include: benzil, and acetyl. Examples of ketone alcohol compounds include: benzoin. Examples of acyloin ether type compounds include: benzoin methylether, benzoin ethylether, and benzoin isopropyl ether. Examples of acyl phosphine oxide compounds include: 2,4,6-trimethyl-benzoyl diphenylphosphineoxide, and bis-(2,6-dimethoxy-benzoyl)-2,4,4-trimethylbenzyl phosphineoxide. Examples of quinone compounds include: anthraquinone, and 1,4-naphthoquinone. Examples of compounds containing halogens include: phenacyl chloride, tribromomethyl phenylsulfone, and tris(trichloromethyl)-s-triazine Examples of peroxides include: di-tertbutylperoxide. The aforesaid examples can be used alone or in admixture of two or more thereof as needed.

The amount of the photoinitiator (C) according to the invention used can be adjusted as needed. In one embodiment of the invention, the used amount of the photoinitiator (C) is from 1 to 15 parts by weight based on 100 parts by weight of the used amount of the compound having an ethylenically unsaturated group (B); preferably, the used amount is from 1 to 14 parts by weight; still more preferably, the used amount is from 1 to 13 parts by weight. In another aspect, the used amount of the O-acyloxime compound (C-1) is from 1 to 12 parts by weight based on 100 parts by weight of the used amount of the compound having an ethylenically unsaturated group (B); more preferably, the used amount of the O-acyloxime compound (C-1) is from 1 to 11 parts by weight; still more preferably, the used amount of the O-acyloxime compound (C-1) is from 1 to 10 parts by weight. When using the O-acyloxime compound (C-1), adhesion in a high-temperature and high-humidity condition is improved. In another aspect, the used amount of the thio O-acyloxime compound (C-1-1) is from 1 to 10 parts by weight based on 100 parts by weight of the used amount of the compound having an ethylenically unsaturated group (B); more preferably, the used amount of the thio O-acyloxime compound (C-1-1) is from 1 to 9 parts by weight; still more preferably, the used amount of the thio O-acyloxime compound (C-1-1) is from 1 to 8 parts by weight. When using the thio O-acyloxime compound (C-1-1), adhesion in a high-temperature and high-humidity condition is further improved.

The solvent (D) according to the invention is able to dissolve other organic components completely and the volatility must be high enough to enable the solvent to be evaporated from the dispersion with a small amount of heat at atmospheric pressure. The solvents with a boiling point below than 150° C. at atmospheric pressure are used most usually. Such solvents are aromatic solvents such as benzene, toluene, and xylene; alcohol solvents, such as methanol and ethanol; ether solvents, such as ethylene glycol monopropyl ether, diethylene glycol dimethyl ether, tetrahydrofuran, ethylene glycol monomethyl ether, ethylene glycol monoethyl ether, diethylene glycol monomethyl ether, diethylene glycol diethyl ether, diethylene glycol monobutyl ether; esters solvents, such as ethylene glycol methyl ether acetate, ethylene glycol ethyl ether acetate, propylene glycol methyl ether acetate, propylene glycol ether acetate, propylene glycol propyl ether acetate, ethyl 3-ethoxypropionate; ketone solvent, such as methyl ethyl ketone and acetone. Preferably, diethylene glycol dimethyl ether, propylene glycol methyl ether acetate and ethyl 3-ethoxypropionate are used alone or in admixture of the two and the storage stability of the photosensitive resin composition is the best.

Preferably, the photosensitive resin composition according to the present invention can contain other additives according to the specific requirements for the physical and/or chemical properties. The additives can be chosen by skilled artisans in the field. Examples of the additives are fillers, polymers other than the alkali-soluble resin (A), UV absorbents, anti-coagulants, surfactants, adhesion improving agents, storage stabilizers, and heat resistance improving agents.

In one preferred embodiment of the invention, the fillers are glass, aluminum fillers; the polymers other than the alkali-soluble resin (A) are polyvinyl alcohol, polyglycol monoether, and polyacrylate fluoride.

The UV absorbents are 2-(3-t-butyl-5-methyl-2-hydroxyphenyl)-5-chlorobenzotriazole, or alkoxybenzophenone; and the anti-coagulants include sodium polyacrylate.

The surfactants can improve the coating of the composition according to the invention. In one embodiment of the invention, the surfactants include a fluorine-based surfactants or silicone-based surfactants.

Specific examples of the fluorine-based surfactants include fluorine-based surfactants formed of compounds respectively having a fluoroalkyl or fluoroalkylene group at least at any of the ends. In one embodiment of the invention, the fluorine-based surfactants include 1,1,2,2-tetrafluorooctyl(1,1,2,2-tetrafluoropropyl)ether, 1,1,2,2-tetrafluorooctylhexyl ether, octaethylene glycol di(1,1,2,2-tetrafluorobutyl)ether, hexaethylene glycol (1,1,2,2,3,3-hexafluoropentyl)ether, octapropylene glycol di(1,1,2,2-tetrafluorobutyl)ether, hexapropylene glycol di(1,1,2,2,3,3-hexafluoropentyl)ether, sodium perfluorododecylsulfonate, 1,1,2,2,8,8,9,9,10,10-decafluorododecane, 1,1,2,2,3,3-hexafluorodecane, sodium fluoroalkylbenzene sulfonate, sodium fluoroalkyl phosphate, sodium fluoroalkyl carboxylate, fluoroalkyl polyoxyethylene ether, diglycerin tetra(fluoroalkyl polyoxyethylene ethers), fluoroalkyl ammonium iodide, fluoroalkyl betaine, fluoroalkyl polyoxyethylene ethers, perfluoroalkyl polyoxyethylene ether, and perfluoroalkyl alkanol. In one another embodiment of the invention, the fluorine-based surfactants include BM-1000, BM-1100 (manufactured by BM CHEMIE), Megafac® F142D, F172, F173, F183, F178, F191, F471 and F476 (manufactured by Dainippon Ink and Chemical Industries, Ltd.), Fluorad® FC-170C, FC-171, FC-430, FC-431 (manufactured by Sumitomo chemical), chlorofluorocarbons S-112, S-113, S-131, S-141, S-145, S-382, SC-101, SC-102, SC-103, SC-104, SC-105, SC-106 (manufactured by Asahi Glass Company), F TOP EF301, 303, 352 (manufactured by Shin Akita Chemical Co., Ltd), FTERGENT FT-100, FT-110, FT-140A, FT-150, FT-250, FT-251, FTX-251, FTX-218, FT-300, FT-310, FT-400S (manufactured by NEOSU Ltd.), F-410, F-444, F-445, F-552, F-553, F-554 (manufactured by DIC).

Examples of the silicone-based surfactants are TORE silicone DC3PA DC7PA, SH11PA, SH21PA, SH28PA, SH29PA, SH30PA, SH-190, SH-193, SZ-6032, SF-8427, SF-8428, DC-57, DC-190 (manufactured by Dow Corning Toray Silicone), TSF-4440, TSF-4300, TSF-4445, TSF-4446, TSF-4460, TSF-4452 (manufactured by GE Toshiba silicone).

In addition to said fluorine-based surfactants or silicone-based surfactants, the surfactant refers to polyoxyethylene alkyl ethers, such as lauryl alcohol polyoxyethylene, polyoxyethylene stearic acid ether and polyoxyethylene oleyl ether; polyoxyethylene aryl ethers, such as polyoxyethylene n-octyl phenyl ether and polyoxyethylene n-nonylphenol ether; polyoxyethylene dialkyl esters, such as polyoxyethylene dilaurate and polyoxyethylene distearate; non-ionic surfactants, such as KP341 (manufactured by Shin-Etsu Chemical), poly Flow No. 57, 95 (manufactured by Kyoeisha Yushi Chemical Industries, Ltd.)

The aforesaid examples of surfactants can be used alone or in admixture of two or more thereof.

The adhesion improving agents are able to improve the adhesive force of the substrate, and preferably the adhesion improving agents are functional silane crosslinking agents. Preferably, the functional silane crosslinking agents include a carboxyl, alkenyl, isocyanate, epoxy group, amino, sulfhydryl group or halogen. Examples are as follows: p-hydroxyphenyltrimethoxy silane, 3-methacroxyl propyl trimethoxysilane, vinyl triacetoxylsilane, vinyl trimethoxysilane, vinyl triethoxysilane, vinyl tri(2-methoxyl ethoxy)silane, γ-isocyanate propyl triethoxysilane, 3-epoxy propoxy propyl trimethoxysilane, 2-(3,4-epoxy cyclohexane) ethyl trimethoxysilane, 3-epoxy propoxy dimethyl methoxysilane, 3-aminopropyl trimethoxysilane, N-(2-aminoethyl)-3-aminopropyl trimethoxysilane, N-(2-aminoethyl)-3-aminopropyl methyl dimethoxysilane, 3-mercaptopropyl trimethoxysilane, 3-chloropropyl trimethoxysilane and 3-chloropropyl methyl dimethoxysilane. Those adhesion improving agents can be used independently or mixedly.

The storage stabilizers can be sulphur, quinone, hydroquinone, poly oxide, amine, nitroso compounds or Nitro compounds. Examples are as follows: 4-methoxyphenol, (N-mitroso-N-phenyl)hydroxylamino aluminum, 2,2-thiobis(4-methyl-6-tert-butylphenol) and 2,6-di-tert-butylphenol.

The heat resistance improving agents can be to N-(alkoxy methyl) glycoluril compounds and N-(alkoxy methyl) melamine Examples of said N-(alkoxy methyl) glycoluril compounds are as follows: N,N,N',N'-tetra(methoxy methyl) glycoluril, N,N,N',N'-tetra(ethyoxyl methyl) glycoluril, N,N,N',N'-tetra(n-propoxy methyl) glycoluril, N,N,N',N'-tetra(isopropoxy methyl) glycoluril, N,N,N',N'-tetra(n-butoxy methyl) glycoluril and N,N,N',N'-tetra(tert-butoxy methyl) glycoluril, and preferably N,N,N',N'-tetra(methoxy methyl) glycoluril. Examples of said N-(alkoxy methyl) melamine are as follows: N,N,N',N',N'',N''-hexa(methoxy methyl) melamine, N,N,N',N',N'',N''-hexa(ethyoxyl methyl) melamine, N,N,N',N',N'',N''-hexa(n-propoxy methyl) melamine, N,N,N',N',N'',N''-hexa(isopropoxy methyl) melamine, N,N,N',N',N'',N''-hexa(n-butoxy methyl) melamine, and N,N,N',N',N'',N''-hexa(tert-butoxy methyl) melamine, and preferably N,N,N',N',N'',N''-hexa(methoxy methyl) melamine. Commercialized products are such as NIKARAKKU N-2702 and MW-30M (manufacutred by SANHE CHEMICALS CO. LTD).

The amount of the additives according to the invention can be chosen by skilled artisans in this field. Preferably, The additives are used in an amount ranging generally from 0 to 10 parts by weight, preferably from 0 to 6 parts by weight, and more preferably from 0 to 3 parts by weight, based on 100 parts by weight of the alkali-soluble resin (A).

The present invention also provides a method for forming a thin film on a substrate comprising applying the photosensitive resin composition as mentioned above on the substrate; preferably, the thin film is an overcoat or a spacer.

The present invention also provides a thin film on a substrate, which is obtained by the method as mentioned above.

In one embodiment of the invention, the method for forming the overcoat comprises at least steps of:
(a) applying the photosensitive composition according to the invention on a substrate to form a film;
(b) irradiating at least one part of the film with radiation;

(c) developing the film after radiating with radiation; and
(d) heating the film after development.

The steps are illustrated as follows:

Step (a) is applying the photosensitive composition according to the invention on a substrate to form a film. When forming an overcoat, a pixel layer consisting of red, green and blue colored layers is formed on a transparent substrate, and then the photosensitive resin composition according to the present invention is formed on said pixel layer. When forming a spacer, a transparent conductive film is covered on a transparent substrate having an overcoat and pixel layer, and then a film of said photosensitive resin composition is formed on the transparent conductive film.

In one embodiment of the present invention, said transparent substrate refers to glass or resin substrate, and preferably glass substrate such as soda-lime glass and alkali-free glass. Examples of said resin substrate are as follows: plyethylene terephthalate, polybutylene terephthalate, polyether sulfone, polycarbonate and polyimide.

One embodiment of the transparent conductive film contains NESA film (USA PPG®) having stannic oxide ($SnO_2$) or ITO film having indium oxide-stannic oxide ($In_2O_3$—$SnO_2$), etc on the entire surface.

The manner for forming the film can be coating method or drying film method.

According to the coating method for forming film, the solution of the photosensitive resin composition according to the present invention is coated on said transparent conductive film. Preferably, the coating surface of the film is heated up (pre-baked). The composition solution used in the coating method has a solid content concentration preferably 5 to 50 wt %, more preferably 10 to 40 wt %, and most preferably 15 to 35 wt %. The coating methods include (but not limited to) spraying, roller painting, spin coating, slit die coating, stick coating, inkjet coating, and preferably spin coating or slit die coating method.

On the other hand, the drying film method is conducted in a way that, a photosensitive dry film is stacked and formed after the solution of photosensitive resin composition according to the present invention is coated on the base film and removed with solvent.

The photosensitive resin composition applied in the drying film method has a solid content concentration preferably about 5 to 50 wt %, more preferably 10 to 50 wt % and 20 to 50 wt %, most preferably 30 to 50 wt %. Examples of the base film of the photosensitive dry film are as follows: polyethylene terephthalate (PET), polyethylene, polypropylene, polycarbonate and polyvinyl chloride. The thickness of the base film of the photosensitive dry film is preferably 15 to 125 µm and more preferably 1 to 30 µm.

When not in use, the photosensitive dry film can also be stacked and stored by a coating film. The coating film according to the present invention preferably has de-bonding property to make it not to be separated when not in use and make it easy to be separated when in use. Examples of the coating film having said property are organic silicon release agent sprayed or printed onto a synthetic resin film, such as PET film, polypropylene film, polyethylene film, polyvinyl chloride film and polyurethane film. The thickness of such coating film is preferably about 5 to 30 µm. Such coating film can also be stacked into 2 to 3 layers.

One embodiment of stacking the film by drying film method is conducted in a way of hot-pressing and bonding the transparent photosensitive dry film on a transparent base film.

In the aforesaid method, the film is preferably processed by the coating method, and then by drying film method, and preferably by pre-baking. The pre-baking conditions may differ according to the composition and mixing ratio, preferably heating at 70 to 120° C. for 1 to 15 minutes.

The thickness of film after pre-baking is preferably 0.5 to 10 µm, more preferably 1.0 to 7.0 µm.

Step (b) is irradiating at least one part of the film with radiation. When conducting the irradiation, a photomask with a predetermined pattern can be used.

Examples of the radiation for exposure are visible light, ultraviolet light or far-infrared light; wherein the wavelength of radiation is preferably within the range of 250 to 550 nm (including ultraviolet light), more preferably including 365 nm.

Radiation dose (exposure amount) is measuring the radiation intensity at a wavelength of 365 nm by the luxmeter (OAI Model 356, Optical Associates Inc.), and preferably is 100 to 5,000 J/m$^2$, more preferably 200 to 3,000 J/m$^2$.

Step (c) is developing the film after radiating with radiation for removing the unwanted parts and forming a predetermined pattern.

Examples of the developing solution are inorganic base, such as: sodium hydroxide, potassium hydroxide, sodium carbonate, sodium silicate, sodium metasilicate and ammonia; primary aliphatic amine, such as ethylamine and N-propylamine; secondary aliphatic amine, such as diethylamine and N-propylamine; tertiary aliphatic amine, such as trimethylamine, diethylmethyl amine, dimethyl ethyl amine and triethylamine; tertiary alicyclic acid, such as pyrrole, piperidine, N-methylpiperidine, N-methylmorpholine 1,8-diazabicyclo[5.4.0]-7-undecene, 1,5-diazabicyclo[4.3.0]-5-nonene; tertiary aromatic amine, such as pyridine, methylpyrimidine, lutidine and quinoline; quartus ammonium salt alkaline compound, such as tetramethyl ammonium hydroxide and aqueous solution of tetraethyl ammonium hydroxide; water-soluble organic solvent and/or surfactant such as methanol and ethanol, which can be added into aforesaid alkali compounds as needed.

The developing methods like dipping, impregnation or showering methods are preferably conducted at room temperature to 180° C. for 10 seconds.

After development, the desired pattern is cleaned for 30 to 90 seconds via vapor, and dried up via compressed air or nitrogen.

Step (d) is heating the film after development. The obtained film with the desired pattern is heated up to 100 to 250° C. for 30 to 180 minutes (after-baking) via an appropriate heater like a heating plate or oven.

The aforementioned spacer or overcoat with a desired pattern has excellent properties, such as: compressive strength, abrasive resistance of liquid crystal display alignment film and adhesive force of the substrate.

The present invention further provides a liquid crystal display component comprising the thin film as mentioned above.

The photosensitive resin composition according to the present invention preferably form a spacer and an overcoat at least on one side (preferably both sides) in the liquid crystal display component according to the present invention.

The liquid crystal display component according to the present invention can be manufactured by the following two methods.

(1) An overcoat or spacer is formed with the photosensitive resin composition according to the invention on one or both sides of a primary (electrode) transparent substrate having a transparent conductive film on at least one side as mentioned above. Then, an alignment film with liquid crystal alignment is formed on the transparent conductive film having the spacer and/or overcoat. On those base materials, the surface where the alignment film formed is taken as the inner surface, such that liquid crystal orientations of the various alignment films are arranged anti-parallelly or vertically and reversely configured by a certain gap (intercellular space). The liquid crystals are filled into the intercellular space defined by the surface of the base materials (alignment film), and the filling hole is sealed to form a liquid crystal unit. Therefore, the liquid crystal display component with same alignment on the inner and outer surfaces can be formed by the inner and outer liquid crystal units that formed by bonding a vertical polarizer or the liquid crystal polarization arranged on a substrate surface.

(2) An overcoat or spacer is formed with the photosensitive resin composition according to the invention on one or both sides of a primary (electrode) transparent substrate having a transparent conductive film on at least one side as mentioned above. Then, the adhesive hardened by UV-light is coated along the endpoint of the substrate, and the tiny liquid crystals are dropped onto the substrate via a liquid crystal distributor. Next, those substrates is stacked under the vacuum condition and sealed under irradiation of high-pressure mercury lamp which can transmit UV-light. Finally, the liquid crystal display component is formed by bonding the polarizers inside and outside the liquid crystals.

Examples of the liquid crystal display component according to the present invention are of nematic or smectic liquid crystals, preferably nematic liquid crystals such as Shiff's base type liquid crystal, azoxy liquid crystal, biphenyl liquid crystal, phenylcyclohexane liquid crystal, ester liquid crystal, terphenyl liquid crystal, biphenyl cyclohexane liquid crystal, pyrimidine liquid crystal, dioxane polycycloolefinoctane liquid crystal, bicyclooctane liquid crystal, pentacyclo octane liquid crystal, the chloride liquid crystal, cholesteric liquid crystal such as cholesterol carbonate or bile steroidal liquid crystal, and a ferroelectric liquid crystal added with a chiral agent such as p-decyloxy-benzylidene-p-amino-2-methylbutyl cinnamate (C-15, CB-15, Merck Ltd.).

A Polarizer, alignment extension of polyvinyl alcohol, "H film" for absorbing iodine or H film clamped between a cellulose acetate overcoat and a polarizer can be used on the outer side of the liquid crystals.

The following examples are given for the purpose of illustration only and are not intended to limit the scope of the present invention.

EXAMPLE

The alkali-soluble Resin (A) is prepared according to the formulation in Table 1.
Preparation of Alkali-Soluble Resin (A-1)

A 1000 ml four-necked flask equipped with a nitrogen inlet, a stirrer, a heater, a condenser and a thermometer was added with the feed composition according to the ratio shown in Table 1 with nitrogen introduced. The feed composition comprises 10.0 parts by weight of methyl methacrylate monomer (hereinafter referred to as MAA), 5.0 parts by weight of 2-methacryloyloxyethyl succinate monoester monomer (hereinafter referred to as HOMS), 40.0 parts by weight of glycidyl methacrylate monomer (hereinafter referred to as GMA), 30.0 parts by weight of dicyclopentanyl methacrylate monomer (hereinafter referred to as FA-513M), 15.0 parts by weight of isobornyl methacrylate monomer (hereinafter referred to as IBOMA); solvent was 300 parts by weight of diethylene glycol dimethyl ether (hereinafter referred to as diglyme). The manner of feeding the monomer mixtures can be all at once added. The mixture in the flask was then stirred in an oil bath at a temperature of 70° C., and the photoinitiator of 2.0 parts by weight of 2,2'-azobis(2,4-dimethylvaleronitrile) (hereinafter referred to as ADVN) dissolved in 20 parts by weight of diethylene glycol dimethyl ether was added by five equal amount in one hour interval into the flask. The reaction temperature was maintained at 70° C. in the polymerization process, and the polymerization time was 6.0 hours. After the completion of the polymerization, the polymerization product was taken out from the four-necked flask and the solvent was devolatilized to obtain the alkali-soluble resin A-1.

Preparation of Alkali-Soluble Resin (A-2)

A 1000 ml four-necked flask equipped with a nitrogen inlet, a stirrer, a heater, a condenser and a thermometer was added with the feed composition according to the ratio shown in Table 1 with nitrogen introduced. The feed composition comprises 35.0 parts by weight of 2-methacryloyloxyethyl succinate monomer (hereinafter referred to as HOMS), 20.0 parts by weight of 3,4-epoxycyclohexylmethyl methacrylate monomer (hereinafter referred to as EC-MMA), 5.0 parts by weight of 2-hydroxyethyl methacrylate monomer (hereinafter referred to as HEMA), 20.0 parts by weight of benzyl methacrylate monomer (hereinafter referred to as BzMA), and 20.0 parts by weight of styrene monomer (hereinafter referred to as SM); solvent was 240 parts by weight of propylene glycol ethyl ether acetate (hereinafter referred to as PGMEA). The manner of feeding the monomer mixtures can be all at once added. The mixture in the flask was then stirred in an oil bath at a temperature of 80° C., and the photoinitiator of 2.4 parts by weight of 2,2'-azobis(2,4-dimethylvaleronitrile) (hereinafter referred to as ADVN) dissolved in 20 parts by weight of propylene glycol ethyl ether acetate was added by five equal amount in one hour interval into the flask. The reaction temperature was maintained at 80° C. in the polymerization process, and the polymerization time was 6.0 hours. After the completion of the polymerization, the polymerization product was taken out from the four-necked flask and the solvent was devolatilized to obtain the alkali-soluble resin A-2.

Preparation of Alkali-Soluble Resin (A-3)

A 1000 ml four-necked flask equipped with a nitrogen inlet, a stirrer, a heater, a condenser and a thermometer was added with the feed composition according to the ratio shown in Table 1 with nitrogen introduced. The feed composition comprises 30.0 parts by weight of methyl methacrylate monomer, 20.0 parts by weight of glycidyl methacrylate monomer, 5.0 parts by weight of 3,4-epoxycyclohexylmethyl methacrylate monomer, 10.0 parts by weight of 2-hydroxyethyl methacrylate monomer, 10.0 parts by weight of benzyl methacrylate monomer; 25.0 parts by weight of butadiene monomer (hereinafter referred to as BS); solvent was 200 parts by weight of diethylene glycol dimethyl ether and 40 parts by weight of propylene glycol ethyl ether acetate. The manner of feeding the monomer mixtures can be all at once added. The mixture in the flask was then stirred in an oil bath at a temperature of 85° C., and the photoinitiator of 3.0 parts by weight of 2,2'-azobis-2-methylbutyronitrile (hereinafter referred to as AMBN) dissolved in 20 parts by weight of diethylene glycol dimethyl ether was added by five equal amount in one hour interval into the flask. The reaction temperature was maintained at 85° C. in the polymerization process, and the polymerization time was 5.0 hours. After the completion of the polymerization, the polymerization product was taken out from the four-necked flask and the solvent was devolatilized to obtain the alkali-soluble resin A-3.

TABLE 1

| Preparation | Composition | | | | | | | | | | | | | | |
|---|---|---|---|---|---|---|---|---|---|---|---|---|---|---|---|
| | Monomer (parts by weight) | | | | | | | | | Solvent (parts by weight) | | Photoinitiator (parts by weight) | | Temp. (°C.) | Time (hour) |
| | (a1) | | (a2) | | (a3) | | | | | | | | | | |
| | MAA | HOMS | GMA | EC-MAA | HEMA | FA-513M | BzMA | IBOMA | BD | SM | Diglyme | PGMEA | AMBN | ADVN | | |
| A-1-1 | 10 | 5 | 40 | | | 30 | | 15 | | | 300 | | | 2.0 | 70 | 6 |
| A-1-2 | | 35 | | 20 | 5 | | 20 | | | 20 | | 240 | | 2.4 | 80 | 6 |
| A-1-3 | 30 | | 20 | 5 | 10 | | 10 | | 25 | | 200 | 40 | 3.0 | | 85 | 5 |

AMBN 2,2'-azobis-2-methyl butyronitrile
ADVN 2,2'-azobis(2,4-dimethylvaleronitrile)
MAA methacrylic acid
HOMS 2-methacryloyloxyethyl succinate monoester
GMA glycidyl methacylate
EC-MAA 3,4-Epoxycyclohexylmethyl methacrylate
HEMA 2-hydroxyethyl methacrylate
FA-513M dicyclopentanyl methacrylate
BzMA benzyl methacrylate
IBOMA Isobornyl methacrylate
BD butadiene
SM styrene monomer
Diglyme diethylene glycol dimethyl ether
PGMEA Propylene glycol ethyl ether acetate Preparation of Photosensitive Resin Composition:

The photosensitive resin composition is prepared according to the formulation in Table 2.

Example 1

100 parts by weight of the alkali-soluble resin (A-1); 60 parts by weight of the compound having an ethylenically unsaturated group (B-1-1); 10 parts by weight of the compound having an ethylenically unsaturated group (B-2-2); 6 parts by weight of the compound having an ethylenically unsaturated group (B-3-1); and 6 parts by weight of the photoinitiator (C-1-1a) were mixed and dissolved in 500 parts by weight of the solvent (D-1) using a shaker to obtain Example 1 of the blue photosensitive resin composition.

Examples 2 to 8 and Comparative Examples 1 to 6

Examples 2 to 8 and Comparative Examples 1 to 6 of photosensitive resin composition were prepared with the same procedure as in Example 1 except: changing the kind and the amount used of the raw materials, the kind and the amount used of the raw materials was shown in Tables 2 and 3.

Overcoat Formation

The photosensitive polysiloxane compositions of the examples and comparative examples were spin-coated on a glass substrate (100 mm×100 mm×0.7 mm) with a thickness of 2 μm. The films were pre-baked at a temperature of 110° C. for 2 minutes. A positive photoresist mask was placed between the exposure machine and the coating films and the films were irradiated with ultraviolet irradiation. After exposure, the films were then immersed in the 2.38% of tetramethylammonium hydroxide solution for 60 seconds at 23° C. The exposed parts of the coating films on the substrate was removed, and then washed with pure water. The films after development were irradiated with 200 mJ/cm². After exposure, the films were post-baked for 60 minutes at 230° C. to obtain the overcoat on the glass.

Assay

Adhesion in a High-Temperature and High-Humidity Condition

The overcoat as mentioned above was dipped in water at 60° C. for 30 minutes. The adhesion assay was based on the 8.5.2 cross-cut tape test of JIS.5400 (1900)8.5. The overcoat was cut by a knife to obtain a 100 mesh and then torn with tape. The number of torn meshes is counted and the criteria of the assay are shown blow:

⊚: 5B;
○: 4B;
Δ: 3B~2B; and
X: 1B~0B;

wherein:
5B: no torn meshes;
4B: 0%<torn meshes≤5%;
3B: 5%<torn meshes≤15%;
2B: 15%<torn meshes≤35%;
1B: 35%<torn meshes≤65%;
0B: 65%<torn meshes≤100%0

TABLE 2

| Component | | | Example | | | | | | | |
|---|---|---|---|---|---|---|---|---|---|---|
| | | | 1 | 2 | 3 | 4 | 5 | 6 | 7 | 8 |
| alkali-soluble resin (A) (parts by weight) | A-1 | A-1-1 | 100 | | | 100 | | | | 80 |
| | | A-1-2 | | 100 | | | 100 | | | |
| | | A-1-3 | | | 100 | | | 100 | 90 | |
| | A-2 | A-2-1 | | | | | | | 10 | |
| | | A-2-2 | | | | | | | | 20 |

TABLE 2-continued

| Component | | | | Example 1 | Example 2 | Example 3 | Example 4 | Example 5 | Example 6 | Example 7 | Example 8 |
|---|---|---|---|---|---|---|---|---|---|---|---|
| compound having an ethylenically unsaturated group (B)(parts by weight) | B-1 | | B-1-1 | 60 | | | | | | | 20 |
| | | | B-1-2 | | 10 | | | | | 30 | |
| | | | B-1-3 | | | 50 | | | 10 | | |
| | | | B-1-4 | | | | 100 | | | | |
| | | | B-1-5 | | | | | 140 | | | |
| | B-2 | | B-2-1 | | 140 | | 10 | | | 70 | |
| | | | B-2-2 | 10 | | | | 10 | | | 30 |
| | | | B-2-3 | | | 20 | | | 10 | 50 | |
| | B-3 | | B-3-1 | 30 | | | | | | | |
| | | | B-3-2 | | | 60 | | | | | |
| photoinitiator (C) (parts by weight) | C-1 | C-1-1 | C-1-1a | 6 | | | | | 4 | | |
| | | | C-1-1b | | 10 | | | | | | |
| | | | C-1-1c | | | | 1 | 3 | | | |
| | | C-1-2 | C-1-2a | | | | 1 | | | | |
| | | | C-1-2b | | 2 | | | | 5 | | |
| | | | C-1-2c | | | | | | 8 | | |
| | C-2 | | C-2-1 | | | | | | 3 | 6 | |
| | | | C-2-2 | | | | | | | | 10 |
| solvent (D) (parts by weight) | D-1 | | | 500 | 1000 | 1500 | 2000 | 500 | 1000 | | |
| | D-2 | | | | | | | 500 | 1000 | 1500 | 1000 |
| additives (E) (parts by weight) | E-1 | | | | | | 0.05 | | | | |
| | E-2 | | | | | | | | | | 1 |
| Ratio of used amount by weight (B-1)/(B-2) | | | | 6.00 | 0.07 | 2.50 | 10.00 | 14.00 | 1.00 | 0.25 | 0.67 |
| Assay | high-temperature resistance and high-humidity resistance | | | ⊚ | ⊚ | ⊚ | ⊚ | ⊚ | ⊚ | ◯ | ◯ |

A-2-1 V259ME (manufactured by Nippon Steel Chemical Co.)
A-2-2 EP4020G (manufactured by Asahi Organic Chemical Industrial Co., Ltd)
B-1-1 5-ethyl-5-(acryloyloxymethyl)-1,3-dioxane, Formula (1-4)
B-1-2 5-[2-(Acryloyloxy)ethyl]carbamoxy-1,3-dioxane, Formula (1-15)
B-1-3 2-(2-acryloyloxy-1,1-dimethylethyl)-5-acryloyloxymethyl-5-ethyl-1,3-dioxane2-, Formula (1-16)
B-1-4 2-dimethyl-4-(acryloyloxymethyl)-1,3-dioxolane, Formula (1-5)
B-1-5 2-ethylene-4-(acryloyloxymethyl)-1,3-dioxolane, Formula (1-6)
B-2-1 Bis(acryloyloxyethyl)hydroxyethyl isocyanurat
B-2-2 Tris [acryloyloxy di(oxyethyl)] isocyanurate
B-2-3 Tris (acryloyloxyethyl) isocyanurate
B-3-1 dipentaerythritol hexaacrylate
B-3-2 dipentaerythritol tetraacrylate
C-1-1a 1-(4-phenyl-thiophenyl)-heptane-1,2-dione 2-oxime-O-benzoate
C-1-2b 1-(4-phenyl-thiophenyl)-octane-1,2-dione 2-oxime-O-benzoate
C-1-3c 1-(4-phenyl-thiophenyl)-propane-3-cyclopentane-1,2-dione 2-oxime-O-benzoate
C-1-2a ethanone-l-[9-ethyl-6-(2-methyl-4-tetrahydrofuran bezoyl)-9H-carbozole-3-yl]-1-(o-acetyl oxime)
C-1-2b 1-[9-ethyl-6-bezoyl-9H-carbozole-3-yl]-ethanone-1-(o-acetyl oxime)
C-1-2c 1-[9-ethyl-6-(2-methylbezoyl)-9H-carbozole-3-yl]-ethanone-1-(o-acetyl oxime)
C-2-1 IRGACURE 369 (manufactured by Ciba Specialty Chemicals)
C-2-2 IRGACURE 907 (manufactured by Ciba Specialty Chemicals)
D-1 Propylene glycol monoethyl ether acetate
D-2 Diethylene glycol dimethyl ether
E-1 F-554 (manufactured by DIC)
E-2 3-glycidoxypropyltrimethoxysilane (manufactured by Shin-Etsu Chemical Co., Ltd.)

TABLE 3

| Component | | | Comparative Example 1 | Comparative Example 2 | Comparative Example 3 | Comparative Example 4 | Comparative Example 5 | Comparative Example 6 |
|---|---|---|---|---|---|---|---|---|
| alkali-soluble resin (A) (parts by weight) | A-1 | A-1-1 | 100 | | | 100 | 80 | 100 |
| | | A-1-2 | | 100 | | | | |
| | | A-1-3 | | | 100 | | | |
| | A-2 | A-2-1 | | | | | | |
| | | A-2-2 | | | | | 20 | |
| compound having an ethylenically unsaturated group (B)(parts by weight) | B-1 | B-1-1 | | | | | | |
| | | B-1-2 | | 10 | | | | |
| | | B-1-3 | | | | 160 | | |
| | | B-1-4 | | | | | 5 | |
| | | B-1-5 | | | | | | |
| | B-2 | B-2-1 | 50 | | | | | |
| | | B-2-2 | | | | | 145 | |
| | | B-2-3 | | | | 10 | | |

TABLE 3-continued

| Component | | | | Comparative Example | | | | | |
|---|---|---|---|---|---|---|---|---|---|
| | | | | 1 | 2 | 3 | 4 | 5 | 6 |
| | B-3 | | B-3-1 | | | 100 | | | 100 |
| | | | B-3-2 | | | | | | |
| photoinitiator (C) (parts by weight) | C-1 | C-1-1 | C-1-1a | 6 | | | | | |
| | | | C-1-1b | | 10 | | | | |
| | | | C-1-1c | | | 8 | | | |
| | | C-1-2 | C-1-2a | | | | | | |
| | | | C-1-2b | | 2 | | 5 | | |
| | | | C-1-2c | | | | | | |
| | C-2 | | C-2-1 | | | | | | 10 |
| | | | C-2-2 | | | | | 10 | |
| solvent (D) (parts by weight) | D-1 | | | 500 | 1000 | 1500 | 1000 | | 1500 |
| | D-2 | | | | | | 1000 | 1000 | |
| additives (E) (parts by weight) | E-1 | | | | | | | | |
| | E-2 | | | | | | | | |
| Ratio of used amount by weight (B-1)/(B-2) | | | | 0.00 | — | — | 16.00 | 0.03 | — |
| Assay | high-temperature resistance and high-humidity resistance | | | X | X | X | X | X | X |

A-2-1 V259ME (manufactured by Nippon Steel Chemical Co.)
A-2-2 EP4020G (manufactured by Asahi Organic Chemical Industrial Co., Ltd)
B-1-1 5-ethyl-5-(acryloyloxymethyl)-1,3-dioxane, Formula (1-4)
B-1-2 5-[2-(Acryloyloxy)ethyl]carbamoxy-1,3-dioxane, Formula (1-15)
B-1-3 2-(2-acryloyloxy-1,1-dimethylethyl)-5-acryloyloxymethyl-5-ethyl-1,3-dioxane2-, Formula (1-16)
B-1-4 2-dimethyl-4-(acryloyloxymethyl)-1,3-dioxolane, Formula (1-5)
B-1-5 2-ethylene-4-(acryloyloxymethyl)-1,3-dioxolane, Formula (1-6)
B-2-1 Bis(acryloyloxyethyl)hydroxyethyl isocyanurat
B-2-2 Tris [acryloyloxy di(oxyethyl)] isocyanurate
B-2-3 Tris (acryloyloxyethyl) isocyanurate
B-3-1 dipentaerythritol hexaacrylate
B-3-2 dipentaerythritol tetraacrylate
C-1-1a 1-(4-phenyl-thiophenyl)-heptane-1,2-dione 2-oxime-O-benzoate
C-1-2b 1-(4-phenyl-thiophenyl)-octane-1,2-dione 2-oxime-O-benzoate
C-1-3c 1-(4-phenyl-thiophenyl)-propane-3-cyclopentane-1,2-dione 2-oxime-O-benzoate
C-1-2a ethanone-1-[9-ethyl-6-(2-methyl-4-tetrahydrofuran bezoyl)-9H-carbozole-3-yl]-1-(o-acetyl oxime)
C-1-2b 1-[9-ethyl-6-bezoyl-9H-carbozole-3-yl]-ethanone-1-(o-acetyl oxime)
C-1-2c 1-[9-ethyl-6-(2-methylbezoyl)-9H-carbozole-3-yl]-ethanone-1-(o-acetyl oxime)
C-2-1 IRGACURE 369 (manufactured by Ciba Specialty Chemicals)
C-2-2 IRGACURE 907 (manufactured by Ciba Specialty Chemicals)
D-1 Propylene glycol monoethyl ether acetate
D-2 Diethylene glycol dimethyl ether
E-1 F-554 (manufactured by DIC)
E-2 3-glycidoxypropyltrimethoxysilane (manufactured by Shin-Etsu Chemical Co., Ltd.)

While embodiments of the present invention have been illustrated and described, various modifications and improvements can be made by persons skilled in the art. It is intended that the present invention is not limited to the particular forms as illustrated, and that all modifications not departing from the spirit and scope of the present invention are within the scope as defined in the following claims.

What is claimed is:

1. A photosensitive resin composition comprising:
an alkali-soluble resin (A);
a compound having an ethylenically unsaturated group (B);
a photoinitiator (C); and
a solvent (D);
wherein said compound having an ethylenically unsaturated group (B) comprises a dioxane unsaturated compound (B-1) and an isocyanurate unsaturated compound (B-2) represented by Formula (2), and a ratio of the used amount by weight of the dioxane unsaturated compound (B-1)/isocyanurate unsaturated compound (B-2) is from 0.05 to 15; and
the dioxane unsaturated compound (B-1) comprises a dioxane unsaturated compound having an 1,3-dioxane frame represented by Formula (1-1) and/or a dioxane unsaturated compound having an 1,3-dioxolane frame represented by Formula (1-2):

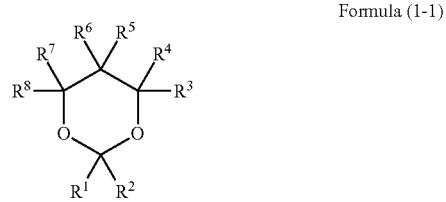

Formula (1-1)

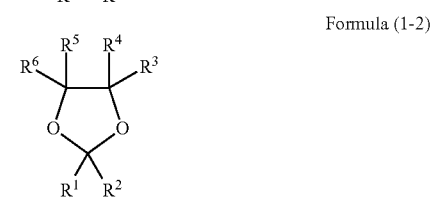

Formula (1-2)

wherein:
in Formula (1-1), $R^1$ to $R^8$ independently represent a hydrogen atom or a hydrocarbon group, and at least one of $R^1$ to $R^8$ has an ethylenically unsaturated group as a substituent at its end portion;

in Formula (1-2), $R^1$ to $R^6$ independently represent a hydrogen atom or a hydrocarbon group, and at least one of $R^1$ to $R^6$ has an ethylenically unsaturated group as a substituent at its end portion;

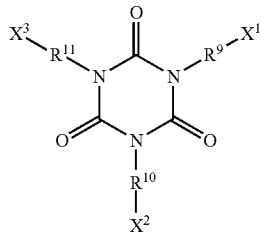

Formula (2)

wherein:

$X^1$, $X^2$ and $X^3$ independently represent a hydrogen atom, (meth)acryloyl group or a hydrocarbon group having 1 to 20 carbon atoms; and at least two of $X^1$, $X^2$ and $X^3$ represent a (meth)acryloyl group; and $R^9$, $R^{10}$ and $R^{11}$ independently represent an oxyalkylene group.

2. The photosensitive resin composition according to claim 1, wherein the alkali-soluble resin (A) is synthesized by polymerizing a mixture comprising an unsaturated carboxylic acid or unsaturated carboxylic acid anhydride compound (a1) and an unsaturated compound containing an epoxy group (a2), or the alkali-soluble resin (A) is synthesized by polymerizing a mixture comprising the unsaturated carboxylic acid or unsaturated carboxylic acid anhydride compound (a1), the unsaturated compound containing an epoxy group (a2) and an other unsaturated compound (a3).

3. The photosensitive resin composition according to claim 1, wherein the photoinitiator (C) comprises an O-acyloxime compound (C-1).

4. The photosensitive resin composition according to claim 3, wherein the O-acyloxime compound (C-1) comprises a thio O-acyloxime compound (C-1-1) represented by Formula (3),

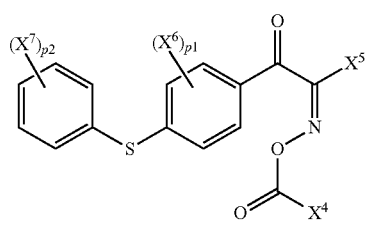

Formula (3)

wherein:

$X^4$ and $X^5$ independently represent a hydrogen atom, a ring, a linear or branched alkyl or aryl group having 1 to 12 carbon atoms, and the alkyl or aryl group is unsubstituted or substituted with a substituent, and the substituent is selected from group consisting of a halogen atom, an alkoxy and aryl group having 1 to 6 carbon atoms;

$X^6$ and $X^7$ independently represent a halogen atom, an alkyl group having 1 to 12 carbon atoms, a cyclopentyl group, a cyclohexyl group, a phenyl group, a benzyl group, a benzoyl group, an alkanoyl group having 2 to 12 carbon atoms, an alkoxycarbonyl group having 2 to 12 carbon atoms, or a phenoxycarbonyl group; and p1 and p2 independently represent an integer from 0 to 5.

5. The photosensitive resin composition according to claim 4, wherein the used amount of the thio O-acyloxime compound (C-1-1) is from 1 to 10 parts by weight based on 100 parts by weight of the used amount of the compound having an ethylenically unsaturated group (B).

6. The photosensitive resin composition according to claim 3, wherein the used amount of the O-acyloxime compound (C-1) is from 1 to 12 parts by weight based on 100 parts by weight of the used amount of the compound having an ethylenically unsaturated group (B).

7. The photosensitive resin composition according to claim 1, wherein the used amount of the compound having an ethylenically unsaturated group (B) is from 20 to 150 parts by weight; the used amount of the dioxane unsaturated compound (B-1) is from 10 to 140 parts by weight; the used amount of the isocyanurate unsaturated compound (B-2) is from 10 to 140 parts by weight; the used amount of the solvent (D) is from 500 to 2000 parts by weight based on 100 parts by weight of the used amount of the alkali-soluble resin (A).

8. The photosensitive resin composition according to claim 1, wherein the used amount of the photoinitiator (C) is from 1 to 15 parts by weight based on 100 parts by weight of the used amount of the compound having an ethylenically unsaturated group (B).

9. A method for forming a thin film on a substrate comprising applying the photosensitive resin composition according to claim 1 on the substrate.

10. The method according to claim 9, wherein the alkali-soluble resin (A) is synthesized by polymerizing a mixture comprising an unsaturated carboxylic acid or unsaturated carboxylic acid anhydride compound (a1) and an unsaturated compound containing an epoxy group (a2), or the alkali-soluble resin (A) is synthesized by polymerizing a mixture comprising the unsaturated carboxylic acid or unsaturated carboxylic acid anhydride compound (a1), the unsaturated compound containing an epoxy group (a2) and an other unsaturated compound (a3).

11. The method according to claim 9, wherein the photoinitiator (C) comprises an O-acyloxime compound (C-1).

12. The method according to claim 11, wherein the O-acyloxime compound (C-1) comprises a thio O-acyloxime compound (C-1-1) represented by Formula (3),

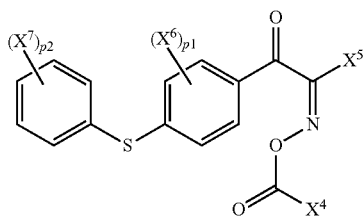

Formula (3)

wherein:

$X^4$ and $X^5$ independently represent a hydrogen atom, a ring, straight-chain or branched-chain alkyl or aryl group having 1 to 12 carbon atoms, and the alkyl or aryl group is unsubstituted or substituted with a substituent, and the substituent is selected from group consisting of a halogen atom, an alkoxy and aryl group having 1 to 6 carbon atoms;

$X^6$ and $X^7$ independently represent a halogen atom, an alkyl group having 1 to 12 carbon atoms, a cyclopentyl group, a cyclohexyl group, a phenyl group, a benzyl group, a benzoyl group, an alkanoyl group having 2 to 12 carbon atoms, an alkoxycarbonyl group having 2 to 12 carbon atoms, or a phenoxycarbonyl group; and p1 and p2 independently represent an integer from 0 to 5.

13. The method according to claim 12, wherein the used amount of the O-acyloxime compound (C-1) is from 1 to 12 parts by weight based on 100 parts by weight of the used amount of the compound having an ethylenically unsaturated group (B).

14. The method according to claim 9, wherein the used amount of the compound having an ethylenically unsaturated group (B) is from 20 to 150 parts by weight; the used amount of the dioxane unsaturated compound (B-1) is from 10 to 140 parts by weight; the used amount of the isocyanurate unsaturated compound (B-2) is from 10 to 140 parts by weight; the used amount of the solvent (D) is from 500 to 2000 parts by weight based on 100 parts by weight of the used amount of the alkali-soluble resin (A).

15. The method according to claim 14, wherein the used amount of the thio O-acyloxime compound (C-1-1) is from 1 to 10 parts by weight based on 100 parts by weight of the used amount of the compound having an ethylenically unsaturated group (B).

16. The method according to claim 9, wherein the used amount of the photoinitiator (C) is from 1 to 15 parts by weight based on 100 parts by weight of the used amount of the compound having an ethylenically unsaturated group (B).

17. A thin film on a substrate, which is obtained by the method according to claim 9.

18. The thin film on the substrate according to claim 17, wherein the thin film is a planarization film of a TFT substrate in a liquid crystal display element or organic light-emitting display device, an interlayer insulating film or an overcoat of a core material or a protective material in a waveguide.

19. An apparatus comprising the thin film on the substrate according to claim 18.

20. An apparatus comprising the thin film on the substrate according to claim 17.

* * * * *